(12) United States Patent
Fu et al.

(10) Patent No.: US 12,119,819 B1
(45) Date of Patent: Oct. 15, 2024

(54) POWER-UP SWITCH-INTERCONNECT CONFIGURATION

(71) Applicant: Flex Logix Technologies, Inc., Mountain View, CA (US)

(72) Inventors: Robert I-Che Fu, Saratoga, CA (US); Frederick A. Ware, Los Altos Hills, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 130 days.

(21) Appl. No.: 18/078,033

(22) Filed: Dec. 8, 2022

Related U.S. Application Data

(60) Provisional application No. 63/288,833, filed on Dec. 13, 2021.

(51) Int. Cl.

| H03K 19/1776 | (2020.01) |
| G11C 11/412 | (2006.01) |
| G11C 11/417 | (2006.01) |
| H03K 19/17704 | (2020.01) |
| H03K 19/17784 | (2020.01) |

(52) U.S. Cl.
CPC ........ *H03K 19/1776* (2013.01); *G11C 11/412* (2013.01); *G11C 11/417* (2013.01); *H03K 19/17704* (2013.01); *H03K 19/17784* (2013.01)

(58) Field of Classification Search
CPC ......... H03K 19/1776; H03K 19/17704; H03K 19/17784; G11C 11/412; G11C 11/417
See application file for complete search history.

(56) References Cited

U.S. PATENT DOCUMENTS

| 6,433,580 | B1 | 8/2002 | Ting |
| 6,608,500 | B1 | 8/2003 | Lacey et al. |
| 7,212,030 | B1 | 5/2007 | Hecht |
| 9,543,958 | B1 * | 1/2017 | Wang ............... H03K 19/17724 |
| 9,755,651 | B2 * | 9/2017 | Wang ................ H03K 19/1776 |
| 10,855,284 | B1 | 12/2020 | Liu et al. |
| 11,277,135 | B2 | 3/2022 | Liu et al. |
| 11,336,287 | B1 | 5/2022 | Rodriguez et al. |
| 2004/0268286 | A1 | 12/2004 | New et al. |
| 2007/0244960 | A1 | 10/2007 | Schmit et al. |
| 2008/0238477 | A1 | 10/2008 | Feng et al. |
| 2017/0093405 | A1 * | 3/2017 | Wang ............... H03K 19/17772 |
| 2019/0286987 | A1 | 9/2019 | Lie et al. |

* cited by examiner

*Primary Examiner* — Daniel D Chang
(74) *Attorney, Agent, or Firm* — Charles Shemwell

(57) ABSTRACT

In an integrated circuit component having a switch interconnect network and a configuration memory, a constituent multiplexer of the switch interconnect network includes a plurality of pass-gates having respective outputs coupled in common to a pass-gate output node, respective inputs that constitute respective signal inputs of the multiplexer, and control inputs coupled to receive respective pass-gate control signals having logic states according to configuration data stored within the configuration memory. Power-up control circuitry within the switch interconnect network drives the pass-gate output node of the multiplexer to a predetermined voltage level following power-up of the integrated circuit component and prior to execution of a programming operation in which one or more word-lines within the configuration memory are activated to store the configuration data within the configuration memory.

21 Claims, 3 Drawing Sheets

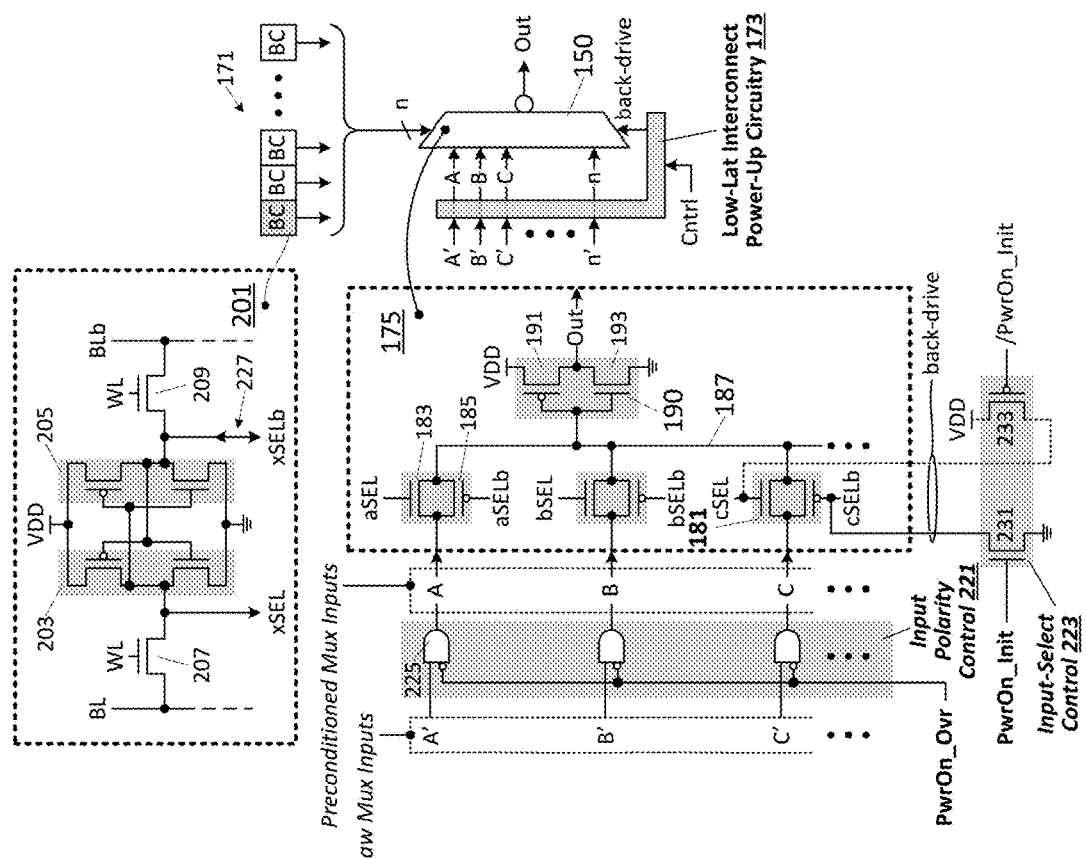
FIG. 3
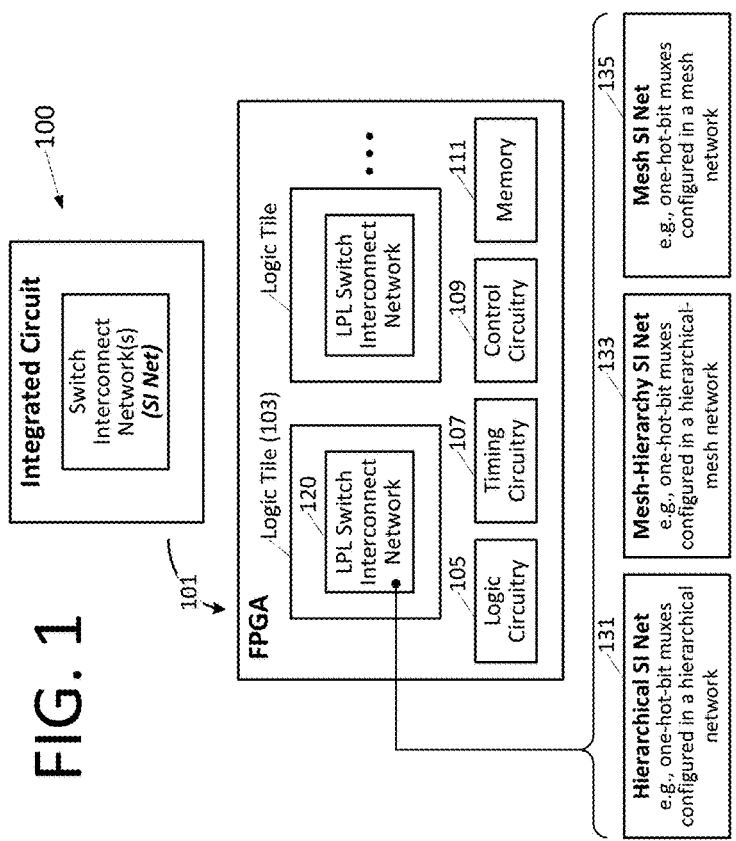
FIG. 1
FIG. 2

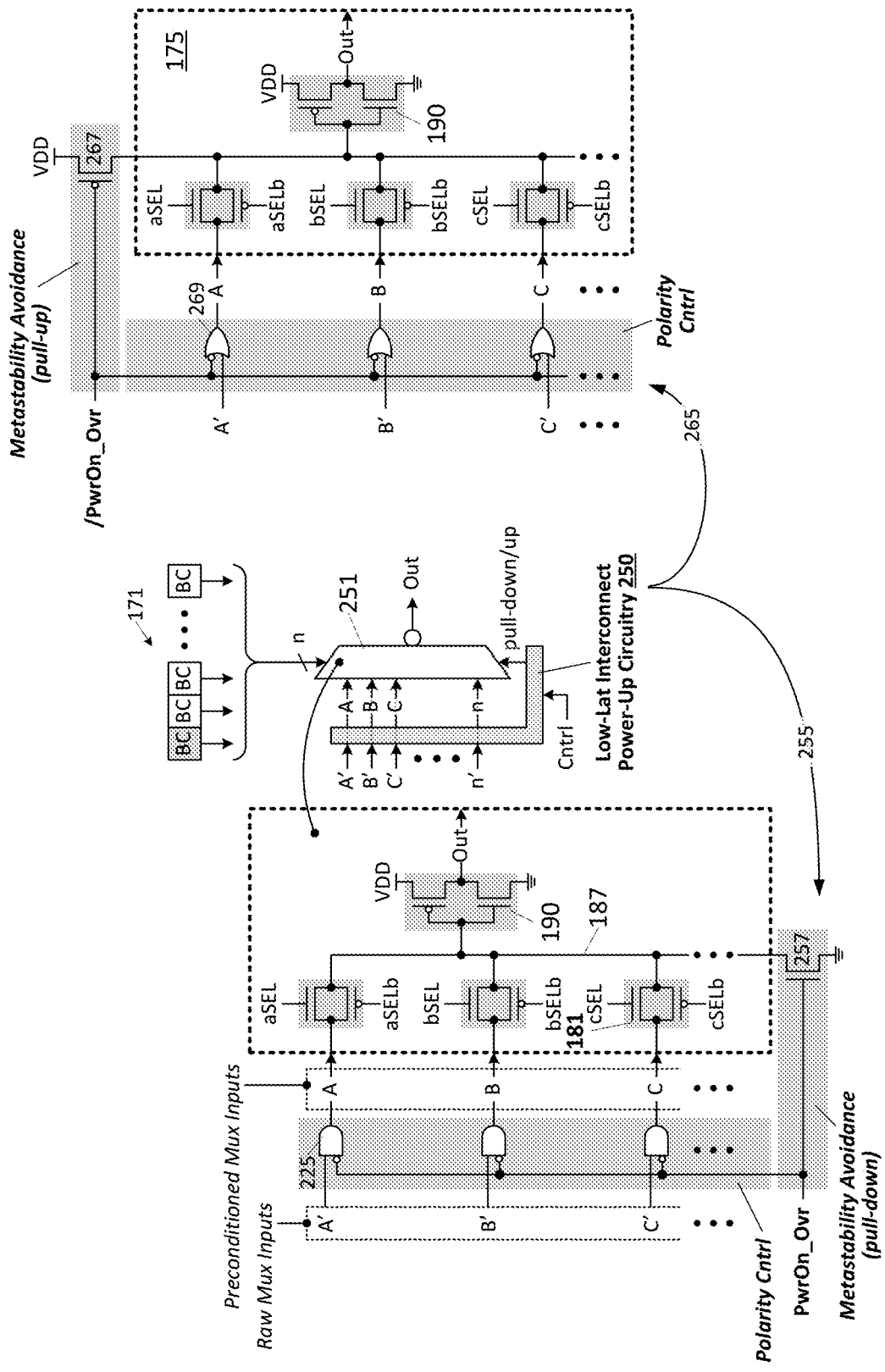

POWER-UP SWITCH-INTERCONNECT CONFIGURATION

CROSS REFERENCE TO RELATED APPLICATIONS

This application hereby claims priority to and incorporates by reference U.S. provisional application No. 63/288,833 filed Dec. 13, 2021.

BRIEF DESCRIPTION OF THE DRAWINGS

The present inventions may be implemented in connection with embodiments illustrated in the drawings hereof. These drawings show different aspects of the present inventions and, where appropriate, reference numerals, nomenclature, and/or names illustrating like circuits, architectures, structures, components, materials and/or elements in different figures are labeled similarly. Various combinations of the structures, components, materials and/or elements, other than those specifically shown, are contemplated within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 1 illustrates exemplary embodiments of a generalized integrated circuit (IC) and more specific FPGA (field programmable gate array) IC having a switch interconnect network (SI net) together with low-latency switch-interconnect power-up circuitry;

FIG. 2 illustrates an embodiment of a "one-hot-bit multiplexer" that may be deployed along with other instances thereof within the switch interconnect network of the generalized IC and/or FPGA shown in FIG. 1, and controlled/initialized during power-up (including power-cycling off and then back on) by low-latency switch interconnect power-up circuitry;

FIG. 3 illustrates inter-coupled embodiments of a programmably-configured one-hot-bit multiplexer (e.g., constituent of a switch interconnect circuit), multiplexer configuration storage, and low-latency interconnect power-up circuitry;

FIG. 4 illustrates an alternative embodiment of a low-latency interconnect power-up circuit together with a one-hot-bit multiplexer;

DETAILED DESCRIPTION

Figure 6:
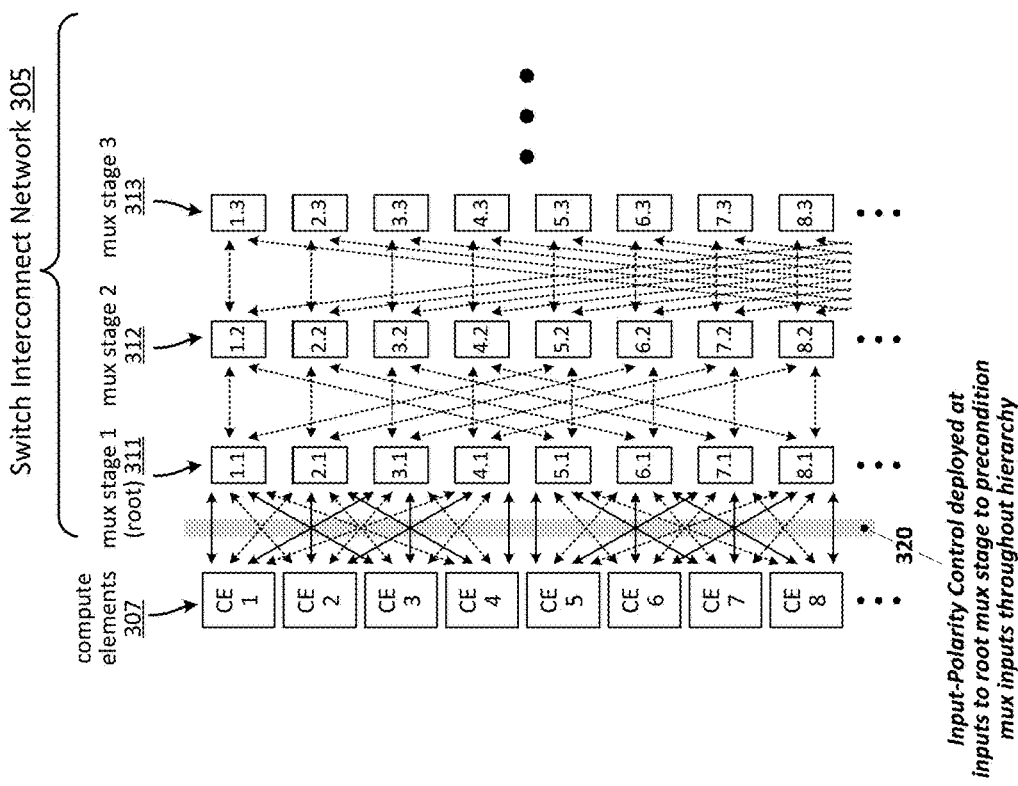
FIG. 6 illustrates an example of limited polarity controller deployment (as discussed in reference to FIG. 5) in the context of a switch interconnect network having multiple hierarchical multiplexer stages, only three of which are specifically shown.

In one aspect, various embodiments disclosed herein are directed to circuitry to control one or more (or all) multiplexers at or during power-up or start-up (i.e., prior to run-time configuration/control of the multiplexers for normal operation) which are employed, connected, arranged and/or configured in a switch interconnect network of an integrated circuit. In another aspect, embodiments herein are directed to methods of controlling such multiplexers, for example, at or during power-up, start-up, initialization, re-initialization, configuration and re-configuration or the like (e.g., before normal operation).

In one embodiment, switch interconnect power-up circuitry of the present inventions (i) programs at least one (and, in one embodiment, only one) of the memory cells of the bit cells that controls the selection circuit of one or more, or all, of the one-hot-bit multiplexers of the switch interconnect network, and/or (ii) enables at least one (and, in one embodiment, only one) of the selection circuits of one or more, or all, of the one-hot-bit multiplexers of the switch interconnect network during power-up or start-up (i.e., before programming the one-hot-bit multiplexers of the switch interconnect network for normal operation via, for example, programming bit cells that determine or select the active or enabled input). Indeed, before the conclusion of the power-up or start-up process, the circuitry of the switch interconnect power-up circuitry of the present inventions may be deactivated or disabled wherein the switch interconnect power-up circuitry terminates (i) maintaining and/or programming the at least one (and, in one embodiment, the only one) of the bit cells to a predetermined data state, and/or (ii) no longer enables at least one of the selection circuits (and thereby no longer selects at least one active input(s)) of one or more, or all, of the one-hot-bit multiplexers of the switch interconnect network.

In addition thereto, and coincident therewith, during the during power-up, start-up, initialization, re-initialization or the like process (collectively referred to herein as power-on or power-up), the switch interconnect power-up circuitry further programs the input signals applied to one or more, or all, of the one-hot-bit multiplexers of a switch interconnect network (e.g., a hierarchical interconnect network and/or mesh interconnect network) to a common or the same polarity or a common or the same data state such that each one-hot-bit multiplexers of the switch interconnect network receives input signals having a common or the same polarity at or during such power-up, start-up, initialization, re-initialization or the like. The input signals may originate, for example, from data storage (register(s), latch(es), memory cell array, etc.), a look-up table (LUT) or multiplexers (for example, another one-hot-bit multiplexer of the interconnect network). While input signals to the one-hot-bit multiplexers are generally described herein as binary signals to convey a single bit per symbol (i.e., having a logic '1' state (also referred to herein as a "high" or "true" logic state) or a logic '0' state (also referred to herein as "low" or "false" logic state)), signals having more than two permissible logic levels to convey more than a single bit per symbol may also propagate through any or all of the various multiplexers discussed herein (e.g., signals having one of four distinct valid voltage ranges to convey two-bit symbols; signals having one of eight distinct valid voltage ranges to convey three-bits per symbol; etc.).

As noted above, at or before completion of power-up operations, the switch interconnect power-up circuitry terminates enabling and/or selecting one or more active input(s) of one or more, or all, of the one-hot-bit multiplexers of the switch interconnect network via, in one example, terminating holding and/or maintaining the bit cell(s) of the one-hot-bit multiplexer(s) (in one embodiment, at least one bit cell of each one-hot-bit multiplexer) to a predetermined data state and/or terminates control or enabling of the selection circuit of the one-hot-bit multiplexer(s). In response, the bit cells connected to the control inputs of the one-hot-bit multiplexers that configure the interconnect network via selecting or determining the active input of the one-hot-bit multiplexers of the switch interconnect network may be programmed with normal operating data to establish a desired or proper connectivity of the switch interconnect network for normal operation.

In addition, after loading mission-mode configuration data into the bit cells associated with input selection within constituent one-hot-bit multiplexers of the switch interconnect network (i.e., to configure the interconnect network for normal/mission-mode operation), the switch interconnect power-up circuitry terminates programming, holding and/or maintaining the input signals to the one-hot-bit multiplexers of the switch interconnect network to a common or the same polarity or data state. Here, the input signal lines employed to transmit signals, via the one-hot-bit multiplexers, in or through the switch interconnect network may be employed to transmit operating signals during normal operation of the network.

As noted above, before completion of power-up, start-up, initialization, re-initialization, re-configuration or the like, the switch interconnect power-up circuitry terminates programming, holding and/or maintaining the bit cell(s) of the one-hot-bit multiplexer(s) (in one embodiment, at least one bit cell of each one-hot-bit multiplexer) to a predetermined data state. Accordingly as part of the power-up operation, the bit cells connected to the control inputs of the one-hot-bit multiplexers (at least one of which is initialized to an active state by the switch-interconnect power-up circuitry) may be programmed with normal operating data to establish a desired or proper connectivity of the switch interconnect network for normal operation.

Thus, during normal operation of the switch interconnect network, the switch interconnect power-up circuitry is inactive or disabled, and the bit cells are programmed, for normal operation, with configuration data to implement an interconnect of the one-hot-bit multiplexers, via the control inputs thereof, to establish a desired or proper connectivity of the switch interconnect network. In addition, the input data/signals, during normal operation of the network, include characteristics that are typical during mission-mode operation of the integrated circuit (e.g., the input signals have time-varying logic states and, with respect to a given one-hot-bit multiplexer, may have non-).

As stated above, a one-hot-bit multiplexer may be characterized as a multiplexer receiving a plurality of input signals where, in or during normal or typical operation (i.e., when the integrated circuit is fully operational), one of the separately and individually controllable inputs of the multiplexer is active or selected, via separate and distinct multiplexer control or input select signals, and connected to the output of the of the multiplexer to provide an electrical path from the selected/active input of the multiplexer to its output. For example, in one embodiment, a one-hot-bit multiplexer is a multiplexer where only one of the separately controllable inputs of the multiplexer is active or selected (i.e., electrically coupled to the output of the multiplexer) via separate and distinct multiplexer control or input select signals and the other inputs of the multiplexer are inactive or not selected (i.e., not electrically coupled to the output of the multiplexer) via different and distinct input select signals. The data state of each separate and distinct multiplexer control signal may be stored in memory of a bit cell that is associated with the input and input select circuitry of the one-hot-bit multiplexer.

The switch interconnect power-up circuitry, only (or at least) during or at power-up, start-up, initialization, and/or re-initialization operation or process, (i) controls, programs and/or enables at least one (and, in one embodiment, only one) selection circuits of each one-hot-bit multiplexer of the switch interconnect network and (ii) provides or generates a common polarity or data state of the input signals applied to the inputs of the one-hot-bit multiplexers. In addition, before completion of the power-up, start-up, initialization, and/or re-initialization operation or process, the switch interconnect power-up circuitry disables and disengages (and/or terminates the process) corresponding to the selection circuit of each one-hot-bit multiplexer of the switch interconnect network, to allow or permit proper configuration and use of such multiplexers, for example, via programming of the bit cells that control input selection of the one-hot-bit multiplexers with data associated with normal operation, to establish, provide or facilitate operation of the switch interconnect network of the integrated circuit during normal operation. After and/or upon completion of the power-up, start-up, initialization, re-initialization or re-configuration, (e.g., after loading data into the bit cells associated with input selection of the one-hot-bit multiplexers for use during normal operation), the switch interconnect power-up circuitry terminates programming, holding and/or maintaining the input signals to the one-hot-bit multiplexers of the switch interconnect network to a common or the same polarity or data state.

A one-hot-bit multiplexer may be characterized as a multiplexer receiving a plurality of input signals where, in or during normal or typical operation (i.e., when the integrated circuit is fully operational), one of the separately and individually controllable inputs of the multiplexer is active or selected, via separate and distinct multiplexer control or input select signals, and connected to the output of the of the multiplexer to provide an electrical path from the selected/active input of the multiplexer to its output. For example, in one embodiment, a one-hot-bit multiplexer is a multiplexer where only one of the separately controllable inputs of the multiplexer is active or selected (i.e., electrically coupled to the output of the multiplexer) via separate and distinct multiplexer control or input select signals and the other inputs of the multiplexer are inactive or not selected (i.e., not electrically coupled to the output of the multiplexer) via different and distinct input select signals. The data state of each separate and distinct multiplexer control signal may be stored in memory of a bit cell that is associated with the input and input select circuitry of the one-hot-bit multiplexer.

In a typical configuration, when the switch interconnect network is operational, the bit cells are programmed with normal operation data (e.g., programmed to establish desired or proper connectivity of the switch interconnect network for normal operation) and the signals applied to the inputs of a one-hot-bit multiplexer may be defined or programmed to implement a desired or proper operation during normal operation of the switch network (e.g., electrically connected to, for example, data storage elements, input pins, lookup tables and/or the output of another multiplexer (e.g., one or more other one-hot-bit multiplexer of the switch fabric))— the polarities or states of such signals most likely differ (and are not common).

In one embodiment, the switch interconnect power-up circuitry of the present inventions programs one or more of the bit cells that determine, enable and/or select the active input(s) of all of the one-hot-bit multiplexers of the switch interconnect network—and only at or during power-up, start-up, initialization, re-initialization or the like (i.e., before programming the one-hot-bit multiplexers of the switch interconnect network for normal operation via, for example, programming bit cells that determine or select the active or enabled input). In another embodiment, the switch interconnect power-up circuitry of the present inventions programs only one of the bit cells that determine, enable and/or select the active input(s) of one or more, or all, of the one-hot-bit multiplexers of the switch interconnect network—and only during a portion of the power-up, start-up, initialization or re-initialization of the switch interconnect network. In yet another embodiment, the switch interconnect power-up circuitry of the present inventions programs only one of the bit cells associated with each and every one-hot-bit multiplexer of the switch interconnect network that are employed, connected, organized and/or configured in a switch interconnect network of an integrated circuit—and only during a portion of the power-up, start-up, initialization or re-initialization of the switch interconnect network.

In addition to programming one or more (or all) of the bit cells that determine, enable and/or select the active input(s) of one or more (or all) of the one-hot-bit multiplexers of the switch interconnect network, the switch interconnect power-up circuitry generates input signals, at or during power-up, start-up, initialization, re-initialization or the like, the switch interconnect power-up circuitry of the present inventions also programs a polarity or data state of the signals applied to the inputs of the multiplexers such that the polarity control circuitry applies input signals having the same polarity or data state as the signals applied the inputs of one, some or all of the one-hot-bit multiplexers of the switch interconnect network. The polarity or data state of the signals applied to the inputs of each of the one-hot-bit multiplexers may be the same for each multiplexer (i.e., all inputs of all the one-hot-bit multiplexers may be the same polarity or data state) or different (i.e., the inputs of a first one-hot-bit multiplexer may have a first polarity or data state and the inputs of a second one-hot-bit multiplexer may have a second polarity or data state).

In another aspect, present inventions are directed to methods of controlling the configuration data stored in memory and thereafter applied to the multiplexers (for example, the one-hot-bit multiplexers) of the switch interconnect network, for example, at or during power-up, start-up, initialization, re-initialization, configuration, re-configuration or the like.

In various embodiments herein, low-latency switch interconnect power-up circuitry is presented in the context of a field-programmable gate array (FPGA)—an integrated circuit component (i.e., having one or more integrated-circuit dies) that may be configured and/or reconfigured (hereinafter, unless stated otherwise, collectively "configured" or the like (for example, "configure" and "configurable")) by a user, operator, customer and/or designer before and/or after manufacture. In all instances and embodiments, the switch interconnect power-up circuitry of the present inventions may alternatively be employed, connected, organized and/or configured in a switch interconnect network within a broad variety of integrated circuit (IC) components (e.g., as represented generally at 100 in FIG. 1) including, for example and without limitation, a general-purposes processor, special-purpose processor (e.g., digital signal processor, tensor processor, neural-net processor, etc.), controller, state machine, gate array, programmable gate array (PGA), application-specific IC (ASIC), system-on-chip (SOC), etc., with any of such ICs (including the aforementioned FPGA) deployed/implemented within a multi-chip package (e.g., system in package, three-dimensional IC, etc.) or implemented as a discrete/standalone IC with or without package housing.

Referring to detail view 101 of FIG. 1, an exemplary FPGA component having one or more switch interconnect networks (and associated switch interconnect power-up circuitry according to one or more embodiments disclosed herein) includes an array of logic tiles 103 (i.e., "programmable logic components," "logic cells," "configurable logic blocks" (CLBs), "logic array blocks" (LABs), etc.) together with various support and control circuits (e.g., logic circuitry 105 (including compute elements), timing circuitry 107, control circuitry 109, memory 111, etc.). In the depicted embodiment, each of the logic tiles includes one or more low-power-up-latency (LPL) switch interconnect networks 120, with each such interconnect network comprising configurable interconnects that facilitate communication/signal-exchange between the logic tiles and/or between a logic tile and the support/control circuits. Each logic tile typically includes thousands of transistors which may be configured to perform combinational and/or sequential functions (simple and/or complex) as well as transistors interconnected to form, within LPL switch-interconnect networks 120, a plurality of multiplexers having two or more inputs, an output, input-select circuits (e.g., transistor pass-gates) each coupled respectively between one of the inputs and the output. The multiplexers themselves may be coupled to form a switch-interconnect network having hierarchically interconnected multiplexer stages (i.e., each stage of multiplexers forming a respective tier or branch or root-node within the hierarchy), including mesh-interconnected multiplexers within a given stage (or stages) of the hierarchy, thus yielding a hierarchical, mesh-hierarchical, or even purely mesh-interconnected switch-interconnect network as shown respectively at 131, 133, 135.

In a number of embodiments, the input-select circuits within each switch-interconnect multiplexer include control inputs electrically coupled to outputs of data storage elements (for example, memory cells or bit cells within switch interconnect network 120, memory 111 and/or other support/control circuits) which, when programmed, selectively render the input-select circuits to conducting or non-conducting states and thus determine which input of the multiplexer is connected to the multiplexer output. The data storage elements provided to control the input-select circuits (or any subset thereof) may be implemented by any practicable storage technology, including without limitation, static random access memory cells, dynamic random access memory cells, nonvolatile storage cells (e.g., Flash memory cells, magneto-resistive memory cells, phase-change memory cells, etc.) and so forth. For example, in the context of static cells, the selection inputs may be electrically connected to one or more input pins, flip-flops, latches and/or blocks/arrays of memory (SRAM, for example) that may be programmed after manufacture of the integrated circuit (e.g., after IC power-up in preparation for subsequent mission-mode operation—i.e., operation implementing one or more core functions of the host IC). Where the interconnect-configuring data storage elements power up in arbitrary states (e.g., as is generally the case with data storage elements that require power to maintain data storage), signal contention and/or metastability may arise within switch interconnect networks 120 in the interval between the power-up (supply voltage ramp—also referred to herein as "power on") and completion of storage-element programming—a susceptibility avoided in embodiments herein through provision of power-up control circuitry having negligible impact on mission-mode signal propagation delay/latency, thus implementing a low-power-up-latency switch interconnect network (120) according to various embodiments detailed below.

In various embodiments herein, only one multiplexer input is coupled to the multiplexer output at a time during normal/mission-mode operation of IC 100/FPGA 101 (i.e., one input-select circuit rendered to "enabled" conducting state, all others rendered to disabled, non-conducting state)—a "one-hot-bit multiplexer" configuration effected by ensuring one-hot status of the input-select signals (i.e., only one input-select signal active/hot at a time) and thus, in the case of memory-cell supplied input-select signals, by programming the memory cells for a given multiplexer such that only one memory cell outputs an input-select signal in an enabling (logic true or active) logic state and all other memory cells output respective input-select signals in a disabling (logic false or inactive) logic state. FIG. 2 illustrates an embodiment of such "one-hot-bit multiplexer" 150, showing non-exhaustive examples of various multiplexer input signals, a one-hot set of 'n' input-select signals (also referred to herein as multiplexer control signals or "mux" control signals), and optional inverting output. In a number of embodiments, an inverting implementation of one-hot-bit multiplexer 150 includes input-select circuits implemented by respective CMOS (complementary metal oxide semiconductor) pass-gates having outputs coupled in common to an inverting output buffer/amplifier (e.g., implemented by a CMOS inverter). A non-inverting one-hot-bit multiplexer may be implemented by adding an additional inverting buffer to the output of an inverting multiplexer (e.g., back-to-back CMOS inverters to implement a non-inverting buffer/amplifier) or, where the multiplexer output is known by design or otherwise to drive a high-impedance load (e.g., gate of a MOS transistor), by omitting the buffer stage altogether (i.e., commonly-coupled outputs of pass-gates constitute inverter output). Accordingly, however depicted, each or any of the one-hot-bit multiplexers presented in various embodiments herein may yield an inverted or non-inverted output relative to the selected input. Further, the input signals applied to the inputs of the one-hot-bit multiplexer during normal operation may originate from data storage elements (e.g., memory cell, register, flip-flop, latch, block/array of memory) as discussed above, and/or from input pins of the host integrated circuit die, outputs of other multiplexers and/or any other practicable signal source. Moreover, while multiplexer inputs and outputs are generally shown and described herein as being single-ended signals, any or all multiplexer input and output signals may alternatively be differential signals (i.e., having "true" and "complement" signal components). Also, input-select signals may be stored in encoded fashion and decoded to yield one-hot-bit input-select signals (e.g., two-bit value encoding one of four states and decoded to yield a corresponding set of four one-hot-bit input-select signals in which a different one of the four signals is active for each of the four encoded states) by circuitry external to or within the multiplexer. Further, each input-select circuit may pass sets of N parallel signals (e.g., a value constituted by N=8, N=16, N=32, N=64 bits, etc., including values having non-power-of-two bit depths).

FIG. 3 illustrates inter-coupled embodiments of a programmably-configured one-hot-bit multiplexer 150, multiplexer configuration storage 171, and low-latency interconnect power-up circuitry 173. In the exemplary implementation shown at 175, one-hot-bit multiplexer is implemented by a set of input-select circuits 183 each implemented by a respective CMOS pass gate (i.e., n-type MOSFET 183 and p-type MOSFET 185 coupled channel-parallel between a respective input node and a common output node 187), and a CMOS inverter 190 (implemented by p-type and n-type MOSFETs 191, 193) having an input coupled to the common output node 187 of the input-select-output circuits 183, and an output ("Out") that constitutes an output of one-hot-bit multiplexer 150. Each of storage element or "bit cell" (BC) within multiplexer configuration storage 171 includes, in the example shown at 201, a 6-transistor SRAM storage cell (cross-coupled CMOS inverters 203, 205 formed by n-MOS/p-MOS transistors as in inverter 190), together with word-line-controlled access transistors 207 and 209, with each storage cell outputting a differential input-select signal to the two transistor gates of a respective input-select circuit 181 and thus rendering the input-select circuit to a conducting (switched on, or activated, or enabled) or non-conducting (switched off, deactivated, or disabled) state. In the exemplary storage circuit shown at 201, the differential outputs are designated xSEL and xSELb, where 'x' is a representative designation for the specific 'a', 'b', 'c', etc. designations shown in aSEL/aSELb, bSEL/bSELb, cSEL/cSELb within one-hot-bit multiplexer detail 175 (i.e., one bit cell 201 supplies aSEL/aSELb to the respective gate terminals of input-select circuit 181, another bit cell supplies bSEL/bSELb, etc.).

Still referring to FIG. 3, shortly after IC power-up (i.e., ramping of supply voltages on the power rails of the IC implementing the circuit components shown in FIG. 3 from power-down levels to desired operating potential), multiplexer-control bit cells 171 are programmed to establish a desired multiplexer configuration—i.e., passing a selected input signal (A or B or C or . . . , or n) to the multiplexer output (inverting the input signal in this example, though an additional CMOS inverter may be coupled to the output of inverter 190 to yield a non-inverted output—or inverter 190 may be omitted where downstream loading conditions permit). More specifically, a word-line signal is asserted (e.g., to a CMOS-high voltage) to switch on access transistors 207/209 and thus enable a differential signal driven onto bit line "BL" and complementary bit line "BLb" to drive the bistable cross-coupled inverters to a desired one of two possible logic states—a logic '1' state (BL=1, BLb=0) or a logic '0' state (BL=0, BLb=1). Thereafter, the word-line signal is deasserted to isolate the cross-coupled inverters from the bit lines, leaving those inverters latched in the programmed logic state and allowing the bit lines to be driven with programming values for other bit cells (e.g., disposed within other rows of an SRAM bit cell array).

Data written/programmed within bit cells 171 is lost on IC power-down as the cross-coupled inverters therein cease to function (relinquishing any latched data state). Moreover, when power is restored, the cross-coupled inverters within each bit cell will generally initialize arbitrarily to one of the two bi-stable states—that is, the bit-cell state on power-up will arbitrarily be '1' or '0'. This arbitrary bit cell power-up state means that any number (including zero) of input-select circuits 183 within a given multiplexer 175 may be rendered to a conducting state during the interval between power-rail stabilization (initial power up) and subsequent bit-cell programming. Where the multiplexer input signals may also have arbitrary logic states, low or high, it becomes possible that two or more input-select circuits 183—powering up happenstance in a conducting state per their corresponding bit-cell-sourced multiplexer control signals—may couple input signals having different voltage levels to common output node 187—an unacceptable short-circuit condition at that node. Conversely, where all bit cells coupled to the input-select circuits of a given multiplexer power up in a logic-low (de-select) state, all of the input-select circuits will be switched off, isolating output node 187 (and thus the input to inverter 190) and thereby enabling the potential on output node 187 to float to possibly invalid/metastable voltage levels (i.e., within the invalid range that separates the permissible CMOS logic-high and logic-low voltage ranges) and thus draw undesirably high current through the PMOS and NMOS transistors 191, 193 of inverter 190 (as both transistors may be biased in the ohmic range and therefore conducting), and also yield a metastable inverter output that propagates through downstream circuitry (i.e., rendering downstream CMOS circuitry into high-conduction metastable states). In the FIG. 3 embodiment, both of these undesirable power-up scenarios at node 187—signal contention via multiple signal-conducting input-select circuits or floating/metastability due to zero signal-conducting input-select circuits (i.e., all input-select circuits off)—are avoided through operation of low-latency interconnect power-up circuitry 173.

In the FIG. 3 embodiment, interconnect power-up circuitry 173 includes an input polarity control circuit 221 that preconditions the multiplexer inputs during the brief interval between power-up (i.e., supply voltages within host IC ramp to operating voltage levels) and subsequent bit-cell programming, converting a set of raw multiplexer input signals (A', B', C', . . . ) having arbitrary/diverse logic polarity (e.g., some high, some low) into a preconditioned set of multiplexer input signals (A, B, C, . . . ) having uniform logic levels (uniform polarity). By this operation, signal contention that might otherwise result at output node 186 (i.e., where multiple bit cells power up in an active logic state such that multiple input-select signals couple respective input signals to node 187) is avoided as any two or more signals conducted to common output node 187 are ensured to have the same signal polarity. In the exemplary input-polarity control circuitry 221 shown in FIG. 3, a power-on override signal (PwrOn_Ovr) is asserted promptly at power-up (i.e., as the positive CMOS voltage rail VDD approaches or reaches an operating threshold) and supplied to input terminals of logic gates (225) to gate raw multiplexer input signals (having arbitrary logic high/low signal levels) to a uniform logic level—logic low in this example (each of gates 225 may instead be an OR gate to yield a uniformly logic-high set of preconditioned multiplexer inputs in response to a logic-high power-on override signal). As discussed below, the power-up override signal is maintained in the asserted state until bit-cell programming is complete (i.e., such programming effecting a one-hot set of input-select signals so that only one of input-select circuits 181 drives output node 187), then deasserted to enable mission-mode (normal) operation of the host IC—that is, to enable output node 187 to be driven by the raw input signal corresponding to a bit-cell-programmed multiplexer control setting.

Still referring to FIG. 3, interconnect power-up circuitry also includes an input-select controller 223 to ensure that at least one of the input-select circuits within multiplexer 150 is rendered to a conducting state at power-up. In exemplary implementation shown, the input-select controller generates either a single-ended or differential "back-drive" signal that both enforces the conducting state within a specific one of the input-select circuits 181 (the input-select-circuit driven by input-select signals cSEL/cSELb in this example) and, where the corresponding bit cell powers up in an inactive state, back-drives the cross-coupled inverters therein to the contrary (active) state—in effect programming the bit cell via the bit-cell output line and thus reversing the control-flow direction (i.e., back-driving the bit cell logic state via the bit-cell output line that is otherwise used to convey the bit cell logic state to the input-select circuit—emphasized for example by the bidirectional arrow at 227 within exemplary bit cell 201). In general, a single-transistor may be used to implement the input-select controller (e.g., a pull-down transistor 231 or a pull-up transistor 233), though both pull-down and pull-up transistors may be provided to effect a differential back-drive signal. In the former (single-transistor) case, the input-select controller is activated by assertion of a single-ended power-on initialization signal (PwrOn_Init)—an active-high power-up control signal in the case of an n-MOS pull-down transistor and an active-low signal (/PwrOn_Init) in the case of a p-MOS pull-up transistor (a differential power-up control signal implemented by complementary active-high and active-low component signals may be asserted in a dual-transistor implementation). Also, in one embodiment the input-select controller may output a single back-drive signal (single-ended pull-up or pull-down, or differential pull-up and pull-down) to two or more input-select circuits within respective multiplexers (i.e., single input-select control circuit shared by multiple multiplexers), with constituent transistor(s) of the input-select controller sized to meet current-sourcing and/or current-sinking requirements imposed by the multiple loads.

In one embodiment, the power-on initialization signal is asserted (active high and/or active low) as promptly as possible after system power on and held in the asserted state for a period sufficient to effect back-driven bit-cell programming. After the back-drive programming is complete, and prior to commencement word-line-driven bit-cell programming (i.e., programming via word-line activation to couple the cross-coupled inverters of a given bit cell to corresponding bit lines, BL and BLb via transistors 207, 209), the power-on initialization signal is deasserted, thus leaving the back-drive programmed bit cell to maintain the subject input-select circuit in the conducting state and thus avoiding floating/metastable signal level at output node 187. In contrast to in-path logic solutions to such metastability avoidance (e.g., imposing a logic AND, NAND, OR NOR gate between outputs one or more of the input-select circuit 181 and output node 187 to ensure that output node 187 is driven to a valid logic state despite all-open status of the input-select circuits within a given multiplexer 150), the back-drive programming and enforcement of input-select circuit conduction imposes no additional gate delays in the critical path between the multiplexer input and output—a particularly beneficial latency reduction in the context of a hierarchical-multiplexer interconnect circuitry in which numerous multiplexers 150 may be sequentially traversed by signals propagating from source to destination (i.e., avoiding the cumulative latency of additional gate-delay in each traversed multiplexer).

FIG. 4 illustrates an alternative low-latency interconnect power-up circuit embodiment 250 together with a one-hot-bit multiplexer 251, the latter implemented in the same manner as multiplexer 150 of FIG. 3 (i.e., with input-select circuits 181 coupled via common output node 187 to inverter output stage 190), but with a different interconnect point to power-up circuitry 250. More specifically, instead of back-driving an input to an input-select circuit 181 and back-drive-programming the corresponding one of bit cells 171 (as in FIG. 3), power-up circuitry 250 includes a pull-down or pull-up transistor —257 or 267 as shown in the alternate embodiments at 255 and 265, respectively— coupled between a power rail (ground or VDD in respective embodiments 255 and 265) and the common-output node (187) of multiplexer 251. In the pull-down example at 255, the power-on override signal is asserted at the gate terminal of common-node pull-down transistor 257 until bit-cell programming is complete, thus grounding common-output node 187 (and thereby avoiding signal metastability at the input to inverter 190) while the also preconditioning the raw multiplexer inputs to uniform logic-low (e.g., ground) voltage levels via gates 225. In the pull-up example at 265, an active-low override signal (/PwrOn_Ovr) is applied to the gate of pull-up transistor 267 to pull output node 187 to VDD until bit-cell programming is complete while also preconditioning the raw multiplexer inputs to uniform logic-high voltage levels via gates 269. As in the FIG. 3 embodiment, pull-up transistor 267 or pull-down transistor 257 (metastability avoidance circuitry) may be coupled to respective output nodes 187 of two or more multiplexers and sized accordingly to the number of multiplexer common-nodes to be pulled up or down. Also, logic gates other than those shown at 225/269 may be implemented to effect the temporary multiplexer input uniformity (i.e., during the bit-cell programming interval), including gates that yield inverted outputs relative to the raw inputs after the power-up override signal is deasserted.

Figure 5:
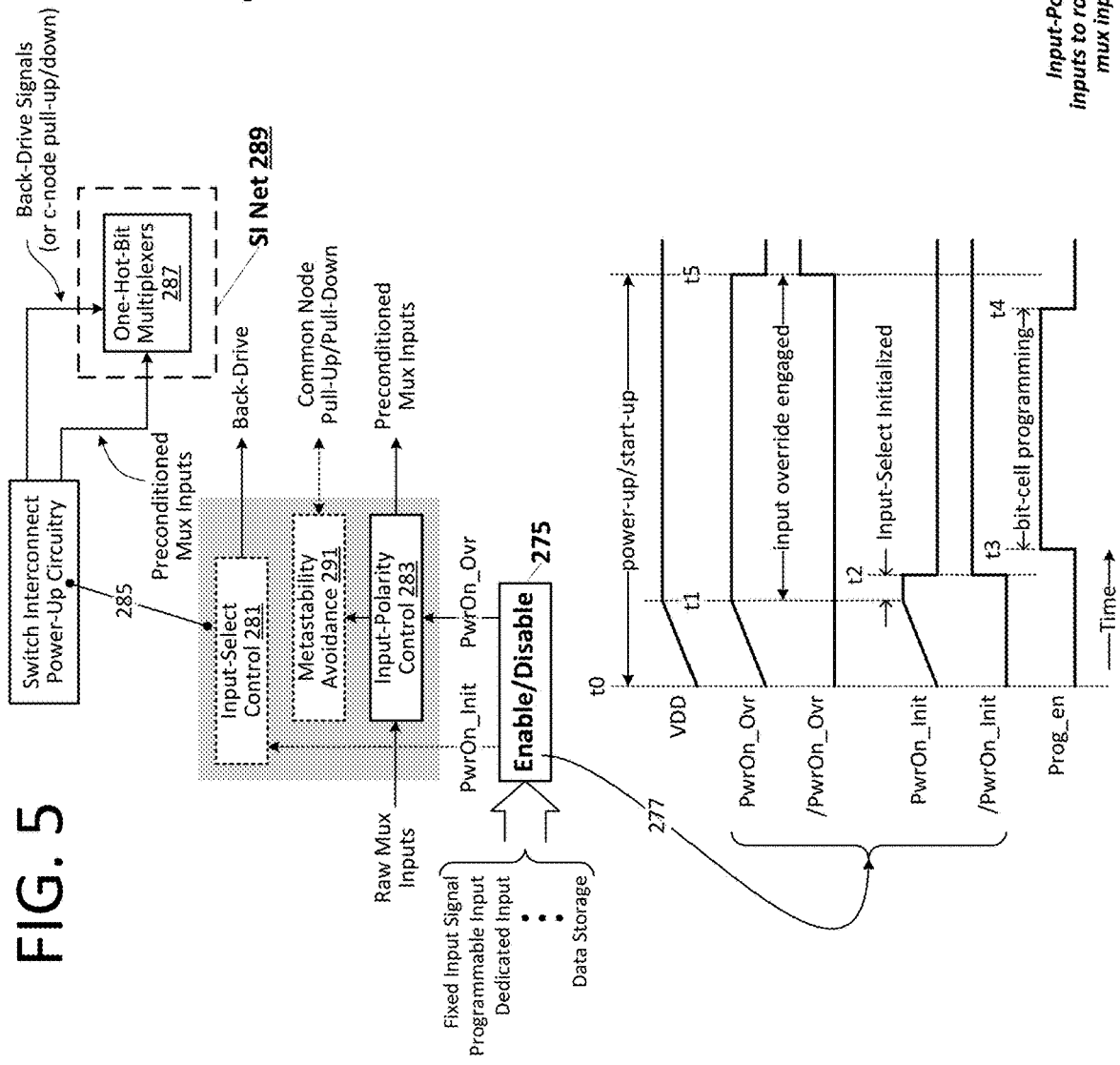
FIG. 5 illustrates an embodiment of a power-up enable/disable circuit that generates the power-on override and power-on initialization signals discussed in reference to FIG. 3, showing exemplary timing of those signals in relation to a power-on supply voltage ramp and bit-cell programming interval.

FIG. 5 illustrates an embodiment of a power-up enable/disable circuit 275 that generates the power-on override and power-on initialization signals discussed above, showing exemplary timing of those signals (277) in relation to a ramping CMOS power rail (i.e., VDD supply voltage ramp) and bit-cell programming interval. As shown, the power-on initialization and override signals are supplied respectively to input-select control circuit and input-polarity control circuit components (281, 283) of switch-interconnect power-up circuitry 285 (itself coupled to multiple on-hot-bit multiplexers 287 within a hierarchical/mesh switch-interconnect network 289). In the depicted embodiment, input-select control circuitry 281 includes multiple instances of the input-select control circuit 223 shown in FIG. 3, with each such circuit instance serving to initialize input-select circuit(s) within one or more multiplexers 287 of switch-interconnect network 289 (each input-select control circuit may be deemed a component of the corresponding one-hot-bit multiplexer within interconnect network 289 or a component of a cluster/group of such multiplexers). The input-polarity control circuitry likewise includes multiple instances of the input-polarity control circuit shown in FIG. 3, with each such circuit serving to gate raw multiplexer inputs for a respective multiplexer, yielding preconditioned multiplexer outputs, for example, until bit-cell programming is complete.

In alternative embodiments, the input-select control circuitry 281 shown in FIG. 3 may be omitted in favor of the metastability avoidance circuitry shown at 291 (circuitry 281 and 291 and the power-up control signals provided thereto shown in dashed outline to emphasize that either may be omitted in favor of the other)—that is, a common-node pull-up or pull-down circuit activated by assertion of the power-up override signal as discussed in reference to FIG. 4. Also, as discussed below, input-polarity control circuitry 283 may be omitted with respect to one-hot-bit multiplexers for which the "raw" inputs have deterministically uniform logic states (i.e., so as to avoid signal contention at the common output of the multiplexer's input-select circuits). For example, where one-hot-bit multiplexers are coupled in a hierarchy in which the inputs to all multiplexers downstream from root-level of multiplexers are fed exclusively by signals propagating from outputs of root-level multiplexers, input polarity control circuitry 283 may be provided to levelized (i.e., precondition to uniform voltage levels) all root-level multiplexer inputs and thereby also levelize the inputs to each subsequent stage of the multiplexer hierarchy (noting that input voltage levels at one hierarchical multiplexer stage may be the inverse of those at preceding and/or succeeding multiplexer stages), thus limiting the input-polarity gating circuitry (and additive latency thereof) to the root level multiplexer inputs.

Referring to the exemplary power-up timing diagram at 277 (FIG. 5), a power-up event (e.g., power applied to voltage supply pins of host IC) commences at t0, with the positive CMOS supply rail ramping to VDD (or within a tolerable range thereof) at t1. In the depicted example, the power-on override signal ramps together with VDD and thus is asserted as promptly as possible within the power-up framework, ensuring that raw multiplexer inputs are preconditioned (e.g., gated to uniform logic levels) until bit cell programming is completed (such operation commencing at t3 and concluding at t4 as shown by the assertion of program-enable signal, Prog_en, during that interval). In the case of FIG. 4 metastability avoidance implementation (i.e., switch-interconnect power-up circuitry 285 includes the Figure-4 metastability pull-up transistor 267 or pull-down transistor 257), assertion of the power-on override signal at or before t1 and continuing at least until bit-cell programming is complete at t4 also serves to avoid common-node metastability within the subject one-hot-bit multiplexers as discussed above. As shown, a complement power-on override signal (/PwrOn_Ovr) also becomes effective (i.e., effecting common-node pull-up when the positive CMOS supply rail ramps to VDD) at or around t1 and remains active-low asserted until bit-cell programming is completed. Accordingly, in the depicted example, enable/disable circuit 275 deasserts the power-on override signal at t5 (lowering PwrOn_Ovr or raising /PwrOn_Ovr), shortly after the bit-cell-programming interval concludes at t4. In alternative embodiments, the enable/disable circuit may deassert the power-on override signal at time t4, thus shortening the power-up/start-up time interval (i.e., more quickly rendering the IC to mission-mode readiness).

The power-on initialization signal (PwrOn_Init), if generated at all, is asserted in the same manner and profile as the power-on override signal—ramping to an asserted level by time t1—but is deasserted at an earlier time, prior to or upon commencement of the bit-cell programming operation at t3 to avoid contention between bit-line and back-drive signal levels (i.e., deasserted at t2 and at least by t3). As shown, the complementary power-on initialization signal (/PwrOn_Init) is held low throughout the interval from t0 to t1 (as the ground-supply voltage may not ramp) and then from t1 to t2—again to effect a back-driven programming of a bit-cell and corresponding activation of an input-select circuit (in this case switching on a PMOS gate within the input-select circuit after VDD ramps to an operational voltage level).

FIG. 6 illustrates an example of limited polarity-control circuitry deployment (as discussed in reference to FIG. 5) in the context of a switch interconnect network 305 having multiple hierarchical multiplexer stages, only three of which are specifically shown. In the depicted implementation, a set of compute elements 307 (e.g., general-purpose processors, tensor processors, neural-net processors, digital-signal processors, state machines, sequencers, etc.) are coupled to root-level multiplexers 311—multiplexer stage 1, or "root-stage" multiplexers—which are coupled in turn to second-stage multiplexers 312, which are coupled to third stage multiplexers 313, etc. In one embodiment each of the connections between a compute element and root-stage multiplexer (and each connection between multiplexers of adjacent stages) is a bidirectional signal path (e.g., having dedicated counter-directed component signal paths, or having one or more signal lines that may be driven in either direction) such that, for example, a given multiplexer block (e.g., root-stage mux "1.1") may include both an outbound signal multiplexer an inbound signal multiplexer. For purposes of explanation, it may be understood that all signals inbound to (i.e., destined for) a given one of compute elements emanated from (was sourced by) either one of the depicted compute elements or from other compute elements (unshown) having a counterpart switch interconnect network (i.e., including root-stage multiplexers followed by second and third stage multiplexers).

Still referring to FIG. 6, by providing power-up polarity-control circuitry 320 (i.e., component(s) of the switch interconnect power-up circuitry shown in FIG. 5) at the inputs to outbound root-stage multiplexers 311 for all compute elements 307 and/or other original signal sources (i.e., sources other than the switch-interconnect multiplexers themselves), all signals flowing out of root-stage multiplexers 311 to downstream multiplexer stags 312, 313, etc. are polarity-controller gated (i.e., upon assertion of one or more power-up override signals) to have uniform and deterministic logic states such that outputs of those root-stage multiplexers and the outputs of all multiplexers downstream from the root-stage multiplexers will likewise have, at each multiplexer stage, uniform and deterministic logic states. Accordingly, within a given switch-interconnect network, power-up polarity-control circuitry need be deployed only at the interface between original signal sources and inputs to root-stage outbound multiplexers (e.g., outputs of compute elements 307 in the FIG. 6 example) to ensure power-up polarity control throughout the switch-interconnect network and any switch-interconnect networks receiving signals therefrom (and vice-versa for any switch-interconnect networks delivering inbound signals to the FIG. 6 switch interconnect network). Note that while purely hierarchical interconnections are shown with respect to the three multiplexer stages shown in the FIG. 6 example, one or more of those stages or other unshown stages may have mesh interconnections (i.e., outputs to and/or inputs from multiplexers of the same hierarchical stage) in addition to hierarchical interconnections (i.e., inputs from one or more multiplexers within a lower (closer to the root) tier of the hierarchy and/or outputs to one or more multiplexers within a higher tier of the hierarchy) or even exclusively mesh interconnections. Also, while not specifically shown in FIG. 6, constituent circuits within input-polarity control circuitry deployed at inputs to root-stage multiplexers may include, for example and without limitation, any of the various logic gates/logic circuits discussed above in reference to FIG. 3. Moreover, where signal inversion occurs from one multiplexer stage to the next, metastability avoidance circuitry such as that shown in FIG. 4 may be implemented by alternated common-node pull-up and pull-down circuit components at successive multiplexer stages (e.g., transistor 267 pulling up the common-output node within one multiplexer stage, and transistor 257 pulling down the common output node at the next multiplexer stage, etc.).

Referring to FIGS. 1-6 generally, the various switch-interconnect circuitry and corresponding power-up control circuitry may be implemented within a standalone integrated circuit component or IC package, or within one or more IC components (including packages having multiple IC dies) that combines the switch interconnect function/architecture with one or more other functions/architectural components (e.g., various compute elements as discussed above etc.). Any or all of those architectural/functional elements may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, links or other interconnection between circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device or register "programming" can include, for example and without limitation, loading a control value into a configuration register, one or more sets of bit cells, and/or other storage circuit within the integrated circuit device in response to a host instruction (and thus controlling an operational interconnect configuration and/or other operating aspect of the device) or through a one-time programming operation (e.g., blowing fuses within a configuration circuit during device production), and/or connecting one or more selected pins or other contact structures of the device to reference voltage lines (also referred to as strapping) to establish a particular device configuration or operational aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit component comprising:
   configuration memory;
   a first multiplexer within a switch interconnect network, the first multiplexer including a plurality of pass-gates having (i) respective outputs coupled in common to a pass-gate output node, (ii) respective inputs that constitute respective signal inputs of the first multiplexer, and (iii) control inputs coupled to receive respective pass-gate control signals from the configuration memory in accordance with configuration data stored within the configuration memory; and
   control circuitry to drive the pass-gate output node to a predetermined voltage level following power-up of the integrated circuit component and prior to execution of a programming operation in which one or more word-lines within the configuration memory are activated to store the configuration data within the configuration memory, the control circuitry to drive the pass-gate output node to the predetermined voltage level including a transistor coupled between one of the control inputs and a supply voltage node and circuitry to switch on the transistor.

2. The integrated circuit component of claim 1 wherein the transistor comprises an n-type metal-oxide-semiconductor transistor coupled between the one of the control inputs and a ground voltage node.

3. The integrated circuit component of claim 1 wherein, when switched on, the transistor coupled between the one of the control inputs and the supply voltage rail conductively couples an output of a storage cell within the configuration memory to the supply voltage rail.

4. The integrated circuit component of claim 3 wherein:
   after switching on the transistor coupled between the one of the control inputs and the supply voltage rail, the control circuitry switches off the transistor prior to execution of the programming operation; and
   the conductive coupling of the output of the storage cell within the configuration memory to the supply voltage rail via the transistor establishes a deterministic logic state within the storage cell that maintains signal assertion at the one of the control inputs such that a corresponding one of the pass-gates remains in a conducting state after the transistor coupled between the one of the control inputs and the supply voltage rail is switched off.

5. The integrated circuit component of claim 4 wherein:
   the storage cell comprises a bi-stable latch element that, as power is initially applied to the integrated circuit component, initializes arbitrarily in either of two logic states; and
   wherein the conductive coupling of the output of the storage cell within the configuration memory to the supply voltage rail establishes, as the deterministic logic state within the storage cell, a deterministic one of the two logic states.

6. The integrated circuit component of claim 4 wherein the storage cell comprises a bi-stable latch element having complementary output nodes to output a differential control signal to differential control inputs of a one of the pass-gates, and wherein the conductive coupling of the output of the storage cell to the supply voltage rail via the transistor comprises a conductive coupling of only one of the complementary output nodes to the supply voltage rail via the transistor.

7. The integrated circuit component of claim 6 wherein the bi-stable latch element comprises first and second inverters each having an output coupled to an input of the other, and wherein the conductive coupling of only one of the complementary output nodes to the supply voltage rail drives an input of the first inverter to a first one of the two logic states corresponding to a voltage level of the supply voltage rail such that (i) an output of the first inverter drives the input of the second inverter to a second one of the two logic states, and (ii) the first and second inverters are latched into the deterministic one of the two logic states within the storage cell.

8. An integrated circuit component comprising:
   configuration memory;
   a first multiplexer within a switch interconnect network, the first multiplexer including a plurality of pass-gates having (i) respective outputs coupled in common to a pass-gate output node, (ii) respective inputs that constitute respective signal inputs of the first multiplexer, and (iii) control inputs coupled to receive respective pass-gate control signals from the configuration memory in accordance with configuration data stored within the configuration memory; and
   control circuitry to assert an override signal throughout a first interval to (i) switch on a transistor coupled between the pass-gate output node and a supply voltage rail, and (ii) enforce uniform voltage levels at the signal inputs of the first multiplexer, wherein the first interval commences following power-up of the integrated circuit component and prior to execution of a programming operation in which one or more word-lines within the configuration memory are activated to store the configuration data within the configuration memory.

9. The integrated circuit component of claim 8 wherein the supply voltage rail comprises a ground voltage rail such that the circuitry to switch on the transistor coupled between the pass-gate output node and the supply voltage rail comprises circuitry to pull the pass-gate output node down toward a ground voltage supply level.

10. The integrated circuit component of claim 8 wherein the supply voltage rail comprises a positive supply voltage rail such that the circuitry to switch on the transistor coupled between the pass-gate output node and the supply voltage rail comprises circuitry to pull the pass-gate output node up toward a positive supply voltage level.

11. A method of operation within an integrated circuit component having a configuration memory and a first multiplexer within a switch interconnect network, the first multiplexer including a plurality of pass-gates having (i) respective outputs coupled in common to a pass-gate output node, (ii) respective inputs that constitute respective signal inputs of the first multiplexer, and (iii) control inputs coupled to receive respective pass-gate control signals from the configuration memory in accordance with configuration data stored within the configuration memory, the method comprising:
   after power-up of the integrated circuit component and prior to activating word-lines within the configuration memory to store the configuration data therein, switching on a transistor coupled between one of the control inputs and a supply voltage rail to drive the pass-gate output node to a predetermined voltage level; and
   activating one or more of the word-lines within the configuration memory to store the configuration data therein.

12. The method of claim 11 wherein switching on the transistor coupled between one of the control inputs and the supply voltage rail comprises switching on an n-type metal-oxide-semiconductor transistor coupled between the one of the control inputs and a ground voltage node.

13. The method of claim 11 wherein switching on the transistor coupled between the one of the control inputs and the supply voltage rail conductively couples an output of a storage cell within the configuration memory to the supply voltage rail.

14. The method of claim 13 further comprising switching off the transistor coupled between the one of the control inputs and the supply voltage rail prior to activating the one or more of the word-lines within the configuration memory to store the configuration data, wherein conductively coupling the output of the storage cell within the configuration memory to the supply voltage rail establishes a deterministic logic state within the storage cell that maintains signal assertion at the one of the control inputs such that a corresponding one of the pass-gates remains in a conducting state after switching off the transistor coupled between the one of the control inputs and the supply voltage rail.

15. The method of claim 14 wherein:
   the storage cell comprises a bi-stable latch element that, as power is initially applied to the integrated circuit component, initializes arbitrarily in either of two logic states; and
   wherein conductively coupling the output of the storage cell within the configuration memory to the supply voltage rail establishes, as the deterministic logic state within the storage cell, a deterministic one of the two logic states.

16. The method of claim 14 wherein the storage cell comprises a bi-stable latch element having complementary output nodes to output a differential control signal to differential control inputs of a one of the pass-gates, and wherein conductively coupling the output of the storage cell to the supply voltage rail comprises conductively coupling only one of the complementary output nodes to the supply voltage rail.

17. The method of claim 16 wherein the bi-stable latch element comprises first and second inverters each having an output coupled to an input of the other, and wherein conductively coupling only one of the complementary output nodes to the supply voltage rail drives an input of the first inverter to a first one of the two logic states corresponding to a voltage level of the supply voltage rail such that (i) an output of the first inverter drives the input of the second inverter to a second one of the two logic states, and (ii) the first and second inverters are latched into the deterministic one of the two logic states within the storage cell.

18. A method of operation within an integrated circuit component having a configuration memory and a first multiplexer within a switch interconnect network, the first multiplexer including a plurality of pass-gates having (i) respective outputs coupled in common to a pass-gate output node, (ii) respective inputs that constitute respective signal inputs of the first multiplexer, and (iii) control inputs coupled to receive respective pass-gate control signals from the configuration memory in accordance with configuration data stored within the configuration memory, the method comprising:
   asserting an override signal throughout a first interval to (i) switch on a transistor coupled between the pass-gate output node and a supply voltage rail, and (ii) enforce uniform voltage levels at the signal inputs of the first multiplexer, wherein the first interval commences following power-up of the integrated circuit component and prior to execution of a programming operation in which one or more word-lines within the configuration memory are activated to store the configuration data within the configuration memory; and
   activating one or more of the word-lines within the configuration memory to store the configuration data therein.

19. The method of claim 18 wherein the first interval concludes after execution of the programming operation is completed.

20. The method of claim 18 wherein the supply voltage rail comprises a ground voltage rail such that switching on the transistor coupled between the pass-gate output node and the ground voltage rail pulls the pass-gate output node down toward a ground voltage supply level.

21. The method of claim 18 wherein the supply voltage rail comprises a positive supply voltage rail such that switching on the transistor coupled between the pass-gate output node and the positive supply voltage rail pulls the pass-gate output node up toward a positive supply voltage level.

\* \* \* \* \*